United States Patent
Matsuura et al.

(10) Patent No.: US 11,432,400 B2
(45) Date of Patent: Aug. 30, 2022

(54) INTERLAYER INSULATING FILM AND METHOD FOR PRODUCING SAME

(71) Applicant: HITACHI CHEMICAL COMPANY, LTD., Tokyo (JP)

(72) Inventors: Masaharu Matsuura, Tokyo (JP); Nobuyuki Ogawa, Tokyo (JP); Shin Takanezawa, Tokyo (JP); Yasuyuki Mizuno, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/324,716

(22) PCT Filed: Aug. 14, 2017

(86) PCT No.: PCT/JP2017/029267
§ 371 (c)(1),
(2) Date: Feb. 11, 2019

(87) PCT Pub. No.: WO2018/030544
PCT Pub. Date: Feb. 15, 2018

(65) Prior Publication Data
US 2019/0182953 A1    Jun. 13, 2019

(30) Foreign Application Priority Data
Aug. 12, 2016 (JP) .............................. JP2016-158797

(51) Int. Cl.
H05K 1/03 (2006.01)
H05K 3/46 (2006.01)
H05K 3/38 (2006.01)
B32B 27/38 (2006.01)
B32B 27/34 (2006.01)
B32B 27/20 (2006.01)

(52) U.S. Cl.
CPC ............ *H05K 1/036* (2013.01); *B32B 27/20* (2013.01); *B32B 27/34* (2013.01); *B32B 27/38* (2013.01); *H05K 1/03* (2013.01); *H05K 1/0373* (2013.01); *H05K 3/386* (2013.01); *H05K 3/46* (2013.01); *H05K 3/4644* (2013.01); *H05K 3/4676* (2013.01); *H05K 2201/0195* (2013.01); *H05K 2201/0209* (2013.01)

(58) Field of Classification Search
CPC ...... H05K 1/036; H05K 1/0373; H05K 3/386; H05K 3/4644
USPC ....................................................... 428/213
See application file for complete search history.

(56) References Cited

U.S. PATENT DOCUMENTS

| 5,397,419 | A  | * | 3/1995 | Furutani | ................. B32B 15/04 156/307.4 |
| 6,133,377 | A  |   | 10/2000 | Nakamura et al. | |
| 2003/0045669 | A1 | * | 3/2003 | Tsuji | .......................... C09J 7/22 528/170 |
| 2004/0256731 | A1 |   | 12/2004 | Mao et al. | |
| 2007/0272124 | A1 | * | 11/2007 | Tsutsumi | ............. H05K 1/0346 106/287.24 |
| 2009/0110909 | A1 |   | 4/2009 | Innocenzo et al. | |
| 2014/0192501 | A1 | * | 7/2014 | Kotake | ................ H05K 1/0326 361/783 |
| 2014/0199533 | A1 | * | 7/2014 | Matsuura | ................. C09J 11/04 428/215 |
| 2017/0221745 | A1 | * | 8/2017 | Ohkoshi | ............. H01L 21/6835 |

FOREIGN PATENT DOCUMENTS

| CN | 103650649 A | 3/2014 |
| CN | 103946263 A | 7/2014 |
| JP | 1-99288 A | 4/1989 |
| JP | 3290296 B2 | 6/2002 |
| JP | 3654851 B2 | 6/2005 |
| JP | 3785749 B2 | 6/2006 |
| JP | 2006-179888 A | 7/2006 |
| JP | 2006179888 A * | 7/2006 |
| JP | 2006-527920 A | 12/2006 |
| JP | 2007-087982 A | 4/2007 |
| JP | 2009-073987 A | 4/2009 |
| JP | 2009-280758 A | 12/2009 |
| JP | 4400337 B2 | 1/2010 |
| JP | 2011-500948 A | 1/2011 |
| JP | 2014-024961 A | 2/2014 |
| TW | 201316848 A | 4/2013 |
| TW | 201641276 A | 12/2016 |

OTHER PUBLICATIONS

Machine_English_translation_JP_2006179888_A; Shibagaki, T.; Jul. 6, 2006; EPO; whole document (Year: 2006).*

* cited by examiner

*Primary Examiner* — Tahseen Khan
(74) *Attorney, Agent, or Firm* — Fitch, Even, Tabin & Flannery LLP

(57) ABSTRACT

Provided is an interlayer insulating film for a multi-layered printed wiring board, including a wiring embedding layer (A) obtained by forming a thermosetting resin composition (I) into a layer, and an adhesion assisting layer (B) obtained by forming a thermosetting resin composition (II) into a layer, in which the interlayer insulating film contains a residual solvent in an amount of 1% to 10% by mass in a total amount of the wiring embedding layer (A) and the adhesion assisting layer (B), and the residual solvent contains an organic solvent having a boiling point of 150° C. to 230° C. in an amount of 10% by mass or more in a total amount of the residual solvent.

19 Claims, No Drawings

INTERLAYER INSULATING FILM AND METHOD FOR PRODUCING SAME

CROSS-REFERENCE TO RELATED APPLICATIONS

This application is a U.S. national phase application filed under 35 U.S.C. § 371 of International Application No. PCT/JP2017/029267, filed Aug. 14, 2017, designating the United States, which claims benefit from Japanese Patent Application 2016-158797, filed Aug. 12, 2016, which are hereby incorporated herein by reference in their entirety.

TECHNICAL FIELD

The present invention relates to an interlayer insulating film and a method for producing the same.

BACKGROUND ART

In recent years, miniaturization, weight reduction, and multi-functionalization of electronic devices are further advanced. With this regard, large scale integration (LSI) and high integration of chip components and the like are advanced, and forms thereof are rapidly changed to multi-pin forms and miniaturized forms. For this reason, in order to increase the mounting density of electronic parts, development of wiring microfabrication of multi-layered wiring boards is advanced. As a method for producing multi-layered wiring boards which are in agreement with these demands, multi-layered wiring boards in a build-up system that uses a glass cloth-free interlayer insulating film as an insulating layer in place of a prepreg and forms a wiring layer through connections to necessary parts with via holes are becoming the main current as a method suited for weight reduction, miniaturization, and wiring microfabrication.

In order to produce such a multi-layered wiring board in a build-up system, an uncured build-up material (interlayer insulating film) is laminated on an inner layer circuit board, and then cured by heating to form an interlayer insulating layer. Thereafter, via holes are formed by laser processing, and by an alkaline permanganic acid treatment or the like, irregularities are formed on the surface of the interlayer insulating layer while a smear treatment is performed, and further, electroless copper plating is performed to form electroless plated copper on the surface of the interlayer insulating layer and the via holes and to form via holes that are capable of providing interlayer connection with lower layers (see, for example, PTLs 1 to 3). Such steps are referred to as a semi-additive process.

The adhesive force between the surface of the interlayer insulating layer and the electroless plated copper is ensured by an anchoring effect of the irregularities on the surface of the interlayer insulating layer, and in order to obtain a sufficient anchoring effect, a surface roughness Ra of approximately 0.6 μm is required.

However, in recent years, in order to increase the speed of information and communication, printed wiring boards are required to have flows of high-frequency electrical signals. In that case, the electrical signals (current) flow only in the vicinity of the surface of a conductor by a phenomenon referred to as a so-called "skin effect", and therefore, it is required to suppress a so-called conductor loss by reducing the roughness of the surface of the conductor.

In addition, from the viewpoint of forming a fine wiring, it is required to reduce the irregularities on the surface of the interlayer insulating layer.

On the other hand, the interlayer insulating layer is required to reduce a coefficient of thermal expansion (reduction in CTE) and increase an elastic modulus in order to enhance processing size stability and reduce the warpage after mounting a semiconductor, and studies thereon are conducted (see, for example, PTLs 4 to 6). As the most mainstream method for reducing CTE, a method for achieving a high filling of a silica filler in a build-up material (for example, 40% by mass or more of a silica filler in a build-up layer) may be mentioned. Incidentally, since the silica filler is a material having a low relative permittivity (Dk) and a low relative loss tangent (Df), it is also effective for reduction in the relative permittivity and the relative loss tangent of the interlayer insulating layer.

However, in the case of performing a high filling of the silica filler in the build-up material, there occurs a problem that it is difficult to ensure an adhesive force between the surface of the interlayer insulating layer and the electroless plated copper. This is considered to be due to a reduction in elongation of the interlayer insulating layer formed by thermosetting the build-up material due to the presence of the silica filler. Therefore, in order to reduce the thermal expansion, it is necessary to increase the adhesive force between the interlayer insulating layer and the electroless plated copper.

In order to solve such a problem, it is proposed to adopt a so-called "bilayered structure" of an interlayer insulating layer, in which the functions of the interlayer insulating layer are separated by using a build-up material having a bilayered structure.

For example, for the purpose of ensuring the adhesion between electroless plating copper and a resin, an insulating film having a bilayered structure formed of an adhesive layer containing an electroless copper plating catalyst and an insulating resin layer is proposed (see, for example, PTL 7). Incidentally, in recent years, a resin composition that increases a mechanical strength in the vicinity of the surface of a build-up layer having a bilayered structure (in the vicinity of an interface with a conductive layer) is proposed (see, for example, PTL 8), and it has been increasingly possible to adopt a bilayered structure of a build-up layer.

CITATION LIST

Patent Literature

PTL 1: Japanese Patent No. 3290296
PTL 2: Japanese Patent No. 3654851
PTL 3: Japanese Patent No. 3785749
PTL 4: JP 2006-527920 A
PTL 5: JP 2007-87982 A
PTL 6: JP 2009-280758 A
PTL 7: JP 1-99288 A
PTL 8: Japanese Patent No. 4400337

SUMMARY OF INVENTION

Technical Problem

In view of the foregoing circumstances, the present inventors have conducted studies on a build-up material (interlayer insulating film) having a bilayered structure, and as a result, they have found that there occurs a problem that handling properties of a film is deteriorated, in particular, in the case of increasing the amount of a silica filler to be blended into a wiring embedding layer. Accordingly, the present inventors have conducted further studies, and have thus found that a method in which a small amount (for example, approximately 4% by mass) of an organic solvent is allowed to remain in an uncured build-up material is effective for improvement of handling properties.

However, in the case of the method in which a small amount of an organic solvent is allowed to remain in an uncured build-up material, voids are generated in an interlayer insulating layer after curing the build-up material by heating, or large irregularities are found on the surface of the interlayer insulating layer in some cases, and accordingly, there is a demand for improvement thereof.

An object of the present invention is to provide an interlayer insulating film which has excellent handling properties and suppresses generation of voids in the obtained interlayer insulating layer and generation of large irregularities on the surface of the interlayer insulating layer; and a method for producing the same.

Solution to Problem

The present inventors have conducted extensive studies in order to accomplish the object, and as a result, the problem as described above can be solved by the following invention, thereby completing the present invention.

That is, the present invention provides the following [1] to [15].

[1] An interlayer insulating film for a multi-layered printed wiring board, including:
a wiring embedding layer (A) obtained by forming a thermosetting resin composition (I) into a layer; and
an adhesion assisting layer (B) obtained by forming a thermosetting resin composition (II) into a layer,
wherein the interlayer insulating film contains a residual solvent in an amount of 1% to 10% by mass in a total amount of the wiring embedding layer (A) and the adhesion assisting layer (B), and the residual solvent contains an organic solvent having a boiling point of 150° C. to 230° C. in an amount of 10% by mass or more in a total amount of the residual solvent.

[2] The interlayer insulating film for a multi-layered printed wiring board as described in [1], further including a support film (C),
wherein the interlayer insulating film includes the wiring embedding layer (A), the adhesion assisting layer (B), and the support film (C) in this order.

[3] The interlayer insulating film for a multi-layered printed wiring board as described in [1] or [2],
wherein the lowest melt viscosity at 60° C. to 140° C. of the wiring embedding layer (A) and the adhesion assisting layer (B) is from 5 to 2,000 Pa·s.

[4] The interlayer insulating film for a multi-layered printed wiring board as described in any one of [1] to [3],
wherein the thermosetting resin composition (I) contains an inorganic filler (d), and the content of the inorganic filler (d) in the thermosetting resin composition (I) is from 40 to 85 parts by mass with respect to 100 parts by mass of the solid content of the thermosetting resin composition (I).

[5] The interlayer insulating film for a multi-layered printed wiring board as described in any one of [1] to [4],
wherein the thermosetting resin composition (I) contains an epoxy resin (a), and the content of the epoxy resin (a) in the thermosetting resin composition (I) is from 20 to 90 parts by mass with respect to 100 parts by mass of the solid content of the thermosetting resin composition (I) excluding the inorganic filler (d).

[6] The interlayer insulating film for a multi-layered printed wiring board as described in [5],
wherein the thermosetting resin composition (I) contains an epoxy resin having a softening point of 40° C. or higher as the epoxy resin (a).

[7] The interlayer insulating film for a multi-layered printed wiring board as described in any one of [1] to [6],
wherein the thermosetting resin composition (II) contains an inorganic filler (d'), and the content of the inorganic filler (d') in the thermosetting resin composition (II) is from 1 to 40 parts by mass with respect to 100 parts by mass of the solid content of the thermosetting resin composition (II).

[8] The interlayer insulating film for a multi-layered printed wiring board as described in any one of [1] to [7],
wherein the thermosetting resin composition (II) contains an epoxy resin (a'), and the content of the epoxy resin (a') in the thermosetting resin composition (II) is from 30 to 90 parts by mass with respect to 100 parts by mass of the solid content of the thermosetting resin composition (II) excluding the inorganic filler (d').

[9] The interlayer insulating film for a multi-layered printed wiring board as described in [8],
wherein the thermosetting resin composition (II) contains an epoxy resin having a softening point of 40° C. or higher as the epoxy resin (a').

[10] The interlayer insulating film for a multi-layered printed wiring board as described in any one of [1] to [9],
wherein the thermosetting resin composition (II) contains a heat-resistant resin (f'), and the heat-resistant resin (f') is at least one selected from the group consisting of a polyamide resin, a polyimide resin, and a polyamideimide resin.

[11] The interlayer insulating film for a multi-layered printed wiring board as described in [10],
wherein the content of the heat-resistant resin (f') in the thermosetting resin composition (II) is from 1 to 30 parts by mass with respect to 100 parts by mass of the solid content of the thermosetting resin composition (II) excluding the inorganic filler (d').

[12] The interlayer insulating film for a multi-layered printed wiring board as described in any one of [1] to [11],
wherein the thickness of the wiring embedding layer (A) is from 5 to 60 μm, and the thickness of the adhesion assisting layer (B) is from 1 to 15 μm.

[13] A method for producing the interlayer insulating film for a multi-layered printed wiring board as described in any one of [1] to [12], including the following steps 1 and 2:
Step 1: a step of applying the thermosetting resin composition (II) onto the support film (C), followed by drying, to form the adhesion assisting layer (B); and
Step 2: a step of applying the thermosetting resin composition (I) onto the adhesion assisting layer (B), followed by drying, to form the wiring embedding layer (A).

[14] The method for producing the interlayer insulating film for a multi-layered printed wiring board as described in [13],
wherein the content of the residual solvent in the adhesion assisting layer (B) before performing the step 2 is 3% by mass or less based on the adhesion assisting layer (B).

[15] The method for producing the interlayer insulating film for a multi-layered printed wiring board as described in [13] or [14],
wherein a concentration of the solid content of the thermosetting resin composition (I) is from 50% to 85% by mass, and
the thermosetting resin composition (I) contains an organic solvent having a boiling point of 150° C. to 230° C., and the content of the organic solvent having a boiling point of 150° C. to 230° C. in the thermosetting resin composition (I) is from 5% to 50% by mass in the total organic solvent contained in the thermosetting resin composition (I).

Advantageous Effects of Invention

According to the present invention, it is possible to provide an interlayer insulating film which has excellent handling properties and suppresses generation of voids in the obtained interlayer insulating layer and generation of large irregularities on the surface of the interlayer insulating layer; and a method for producing the same.

DESCRIPTION OF EMBODIMENTS

[Interlayer Insulating Film]

The interlayer insulating film of the present invention is an interlayer insulating film for a multi-layered printed wiring board, including a wiring embedding layer (A) obtained by forming a thermosetting resin composition (I) into a layer, and an adhesion assisting layer (B) obtained by forming a thermosetting resin composition (II) into a layer, in which the interlayer insulating film contains a residual solvent in an amount of 1% to 10% by mass in a total amount of the wiring embedding layer (A) and the adhesion assisting layer (B), and the residual solvent contains an organic solvent having a boiling point of 150° C. to 230° C. in an amount of 10% by mass or more in a total amount of the residual solvent.

The interlayer insulating film of the present invention is used as a build-up material for a multi-layered printed wiring board, and by thermosetting the wiring embedding layer (A) and the adhesion assisting layer (B) of the interlayer insulating film of the present invention, an interlayer insulating layer for a multi-layered printed wiring board is formed. That is, in the present specification, the "interlayer insulating layer" means a layer formed by thermosetting the wiring embedding layer (A) and/or a layer formed by thermosetting the adhesion assisting layer (B).

A reason why the interlayer insulating film of the present invention has excellent handling properties and suppresses generation of voids in the obtained interlayer insulating layer and generation of large irregularities on the surface of the interlayer insulating layer is not clear, but is considered to be as follows.

Since the residual solvent included in a build-up material having a bilayered structure in the related art is a low-boiling point solvent, it is expanded in the build-up material or on the surface thereof due to rapid vaporization during thermosetting, and thus, irregularities and air bubbles remain in the obtained interlayer insulating layer. This problem is likely to be caused particularly in the case where the amount of the silica filler is large. This is considered to be caused for the following reason: as the area of an interface between the resin and the filler becomes is wider, a skinning (only the surface being changed into a dry state) on the surface of the build-up material due to rapid boiling of the solvent is accelerated and the solvent trapped inside is likely to evaporate, and as a result, irregularities and air bubbles are generated.

It is considered that since the interlayer insulating film of the present invention contains a high-boiling point organic solvent as a residual solvent, it is possible to suppress rapid vaporization, so that air bubbles hardly remain in the interlayer insulating film, and it is also possible to suppress the air bubbles from moving onto the surface of the interlayer insulating film to leave the irregularities thereon. In addition, it is considered that by adjusting the content of the residual solvent and the content of the high-boiling point organic solvent in the residual solvent within specific ranges, it is possible to suppress generation of voids and irregularities of the interlayer insulating layer while not impairing excellent handling properties and heat resistance of the film.

<Wiring Embedding Layer (A)>

The wiring embedding layer (A) is a layer obtained by forming the thermosetting resin composition (I) into a layer.

The wiring embedding layer (A) is a layer that is directly in contact with a circuit board during lamination, and has a function of being melted and flowing to embed the circuit board in the case where a multi-layered printed wiring board is produced using the interlayer insulating film of the present invention. Incidentally, in the case where through holes, via holes, and the like are present in the circuit board, the wiring embedding layer has a function of flowing thereinto and filling the inside of the holes.

From the viewpoint of the handling properties, it is preferable that the wiring embedding layer (A) is solid at 40° C. or lower; and from the viewpoint of embeddability, it is preferable that the laminate is melted during heating.

The lamination temperature is usually 60° C. to 140° C., and from the viewpoints of productivity and energy saving, the lamination temperature is preferably 60° C. to 120° C., and more preferably 70° C. to 120° C. Accordingly, the melting temperature of the wiring embedding layer (A) is preferably within the range of the lamination temperature.

In addition, in the interlayer insulating film of the present invention, the wiring embedding layer (A) may be in an uncured state or may be in a semi-cured state.

The thickness of the wiring embedding layer (A) may be adjusted in accordance with a desired thickness of the interlayer insulating layer, but is usually 5 to 60 μm, and from the viewpoint of reducing the thickness of the multi-layered printed wiring board, the thickness is preferably 5 to 50 μm, and more preferably 5 to 40 μm. In the case where the thickness of the wiring embedding layer (A) is 5 μm or more, the insulation reliability is excellent, and in the case where the thickness of the wiring embedding layer (A) is 60 m or less, it is advantageous to reduce the thickness of the multi-layered printed wiring board.

(Thermosetting Resin Composition (I))

The thermosetting resin composition (I) contains a thermosetting resin.

As the thermosetting resin, a thermosetting resin that thermally cures at a general thermosetting temperature of 150° C. to 230° C. is preferable from the viewpoint of productivity.

Examples of the thermosetting resin include an epoxy resin, a cyanate ester compound, a bismaleimide compound, a bis-allyl-nadi-imide resin, a benzoxazine compound, and a polymerization product of a bismaleimide compound and a diamine compound. Among these, the epoxy resin, the polymerization product of a bismaleimide compound and a diamine compound, or the cyanate ester compound is preferable, and from the viewpoint of excellent chemical resistance, the epoxy resin (hereinafter, also referred to as an "epoxy resin (a)") is more preferable.

[Epoxy Resin (a)]

As the epoxy resin (a), an epoxy resin having two or more epoxy groups on average in one molecule is preferable from the viewpoints of chemical resistance and heat resistance.

Examples of the epoxy resin (a) include a bisphenol A-type epoxy resin, a bisphenol F-type epoxy resin, a bisphenol S-type epoxy resin, a biphenol-type epoxy resin, a naphthalene-type epoxy resin, a dicyclopentadiene-type epoxy resin, a phenol novolac-type epoxy resin, a cresol novolac-type epoxy resin, an aralkyl-type epoxy resin, and an aralkyl novolac-type epoxy resin. The epoxy resin (a) may be used alone or in combination of two or more kinds thereof. Among those, from the viewpoint of obtaining an interlayer insulating layer having a small surface roughness and excellent adhesiveness with a conductor layer, the aralkyl novolac-type epoxy resin is preferable, and an aralkyl novolac-type epoxy resin having a biphenyl skeleton (biphenyl aralkyl-type epoxy resin) is more preferable. The aralkyl novolac-type epoxy resin having a biphenyl skeleton refers to an aralkyl novolac-type epoxy resin containing aromatic rings of a biphenyl derivative in a molecule thereof, and examples thereof include an epoxy resin including a structural unit represented by general formula (a-1).

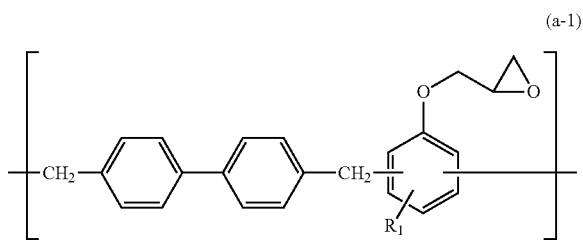

(a-1)

In general formula (a-1), $R_1$ represents a hydrogen atom or a methyl group.

The content of the structural unit represented by general formula (a-1) in the epoxy resin including the structural unit represented by general formula (a-1) is preferably 50% by mass or more, more preferably 70% by mass or more, and still more preferably 80% by mass or more, from the viewpoint of obtaining an interlayer insulating layer having a small surface roughness and excellent adhesiveness with a conductor layer.

Examples of the epoxy resin including the structural unit represented by general formula (a-1) include an epoxy resin represented by general formula (a-2).

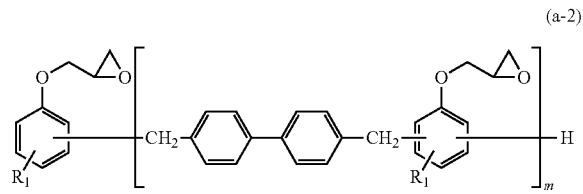

(a-2)

In general formula (a-2), $R_1$ is the same as above and m represents an integer of 1 to 20. Plural $R_1$'s may be the same as or different from each other.

As the epoxy resin (a), a commercially available product thereof may be used. Examples of the epoxy resin as a commercially available product include "NC-3000-H" (an epoxy resin in which m in general formula (a-2) is 2.8, softening point: 70° C.) and "NC-3000" (an epoxy resin in which m in general formula (a-2) is 1.7, softening point: 56° C.) (both manufactured by Nippon Kayaku Co., Ltd.).

The content of the epoxy resin (a) in the thermosetting resin composition (I) is preferably 20 to 90 parts by mass, more preferably 25 to 80 parts by mass, and still more preferably 30 to 75 parts by mass, with respect to 100 parts by mass of the solid content of the thermosetting resin composition (I) excluding the inorganic filler (d). In the case where the content of the epoxy resin (a) is 20 parts by mass or more, the chemical resistance of the interlayer insulating layer is excellent, and in the case where the content of the epoxy resin (a) is 90 parts by mass or less, the curability is improved.

In the present specification, the "solid content" is a non-volatile content except for the materials that volatilize an organic solvent and the like, and represents components which remain while being not volatilized at a time of drying the resin composition. Examples of the solid content include a liquid form, a syrupy form, and a waxy form at room temperature. Further, the "non-volatile content" is a component that is not evaporated at a time of exposing the thermosetting resin composition to an environment at 200° C. for 60 minutes. In addition, in the present specification, room temperature represents 25° C.

Furthermore, the thermosetting resin composition (I) preferably contains an epoxy resin having a softening point of 40° C. or higher as the epoxy resin (a) from the viewpoint of a glass transition temperature (Tg), and more preferably contains a multifunctional epoxy resin having a softening point of 40° C. or higher.

The content of the epoxy resin having a softening point of 40° C. or higher in the epoxy resin (a) is preferably 80% by mass or more, more preferably 85% by mass or more, and still more preferably 90% by mass or more.

[Epoxy Curing Agent (b)]

In the case where the epoxy resin (a) is contained as the thermosetting resin, it is preferable that the thermosetting resin composition (I) contains an epoxy curing agent (b).

Examples of the epoxy curing agent (b) include a phenol resin-based curing agent, an acid anhydride-based curing agent, an amine-based curing agent, a hydrazide-based curing agent, and an active ester-based curing agent. Among these, the phenol resin-based curing agent is preferable.

Examples of the phenol resin-based curing agent include novolac-type phenol resins such as a phenol novolac resin and a cresol novolac resin; and resol-type phenol resins, and among these, from the viewpoint of improving reliability, the novolac-type phenol resin is preferable.

As the novolac-type phenol resin, a commercially available product thereof may be used, and examples of the commercially available product include "PHENOLITE (registered trademark) TD-2090" which is a phenol novolac resin, "PHENOLITE (registered trademark) LA-1356" and "PHENOLITE (registered trademark) LA7050 Series" which are triazine-containing phenol novolac resins, and "PHENOLITE (registered trademark) LA-3018" which is a triazine-containing cresol novolac resin (all manufactured by DIC Corporation).

Examples of the acid anhydride-based curing agent include phthalic anhydride, benzophenonetetracarboxylic dianhydride, and methylhimic anhydride, and examples of the amine-based curing agent include dicyandiamide, diaminodiphenylmethane, and guanylurea.

The epoxy curing agent (b) may be used alone or in combination of two or more kinds thereof.

The content of the epoxy curing agent (b) is preferably such an amount that the equivalent ratio [(b)/(a)] of the active hydrogen of the epoxy curing agent (b) to the epoxy group of the epoxy resin (a) is 0.5 to 1.5, and more preferably such an amount that the equivalent ratio [(b)/(a)] is 0.8 to 1.2.

[Curing Accelerator (c)]

From the viewpoint of accelerating a curing reaction, it is preferable that the thermosetting resin composition (I) further contains a curing accelerator (c).

Examples of the curing accelerator (c) include imidazole compounds such as 2-phenylimidazole, 2-ethyl-4-methylimidazole, and 1-cyanoethyl-2-phenylimidazolium trimellitate; organophosphorus compounds such as triphenylphosphine; onium salts such as phosphonium borate; amines such as 1,8-diazabicycloundecene; and 3-(3,4-dichlorophenyl)-1,1-dimethylurea. The curing accelerator (c) may be used alone or in combination of two or more kinds thereof.

From the viewpoints of curability and storage stability, the content of the curing accelerator (c) in the thermosetting resin composition (I) is preferably 0.05 to 5 parts by mass, more preferably 0.1 to 2 parts by mass, and still more preferably 0.2 to 1 part by mass, with respect to 100 parts by mass of the epoxy resin (a).

[Inorganic Filler (d)]

It is preferable that the thermosetting resin composition (I) further contains an inorganic filler (d).

By incorporating the inorganic filler (d), it is possible to reduce a thermal expansion coefficient of the obtained interlayer insulating layer as well as to enhance high-frequency characteristics and an elastic modulus.

Examples of the inorganic filler include silica, alumina, barium sulfate, talc, clay, mica powder, aluminum hydroxide, magnesium hydroxide, calcium carbonate, magnesium carbonate, magnesium oxide, boron nitride, aluminum borate, titanium barium, strontium titanate, calcium titanate, bismuth titanate, titanium oxide, barium zirconate, and calcium zirconate. The inorganic filler (d) may be used alone or in combination of two or more kinds thereof. Among these, from the viewpoint of reducing the thermal expansion coefficient of the interlayer insulating layer, silica is preferable.

The average particle diameter of the inorganic filler (d) is preferably 0.01 to 3.0 μm, more preferably 0.1 to 2.0 μm, and still more preferably 0.3 to 1.0 μm. In the case where the average particle diameter is 0.01 μm or more, it is possible to suppress the melt viscosity to a lower value, and therefore, the embeddability of the circuit board is improved, and in the case where the average particle diameter is 3.0 μm or less, fine wiring forming properties are excellent.

From the viewpoint of melt viscosity, embeddability of through holes, circuit patterns, and the like, the shape of the inorganic filler (d) is preferably spherical.

As the inorganic filler (d), an inorganic filler subjected to a surface treatment with a surface treatment agent such as a silane coupling agent may be used.

Examples of the silane coupling agent include an aminosilane coupling agent, a vinylsilane coupling agent, and an epoxysilane coupling agent.

In the case where the thermosetting resin composition (I) contains the inorganic filler (d), the content of the inorganic filler (d) is preferably 40 to 85 parts by mass, more preferably 50 to 80 parts by mass, and still more preferably 55 to 80 parts by mass, with respect to 100 parts by mass of the solid content of the thermosetting resin composition (I). In the case where the content of the inorganic filler (d) is 40 parts by mass or more, the thermal expansion coefficient and the elastic modulus are excellent, and in the case where the content of the inorganic filler (d) is 85 parts by mass or less, the embeddability of the circuit board is excellent.

[Organic Solvent (e)]

It is preferable that the thermosetting resin composition (I) contains an organic solvent (e). Further, in the present specification, the thermosetting resin composition (I) containing an organic solvent is referred to as a "varnish for a wiring embedding layer" in some cases.

The organic solvent (e) contained in the varnish for a wiring embedding layer can also play a role as a residual solvent contained in the interlayer insulating film by intentionally allowing the organic solvent (e) to remain in the wiring embedding layer (A) during the production of the interlayer insulating film of the present invention. Accordingly, an organic solvent allowed to remain in the interlayer insulating film of the present invention as the residual solvent is preferably used as the organic solvent (e).

The organic solvent (e) is preferably a liquid at 20° C. to 30° C., and examples thereof include ketones such as acetone, methyl ethyl ketone, methyl isobutyl ketone, and cyclohexanone; acetic esters such as ethyl acetate, butyl acetate, cellosolve acetate, propylene glycol monomethyl ether acetate, and carbitol acetate; carbitols such as cellosolve, methyl carbitol, and butyl carbitol; aromatic hydrocarbon solvents such as toluene and xylene; dimethyl formamide, dimethyl acetamide (hereinafter also referred to as "DMAc"), N-methylpyrrolidone (hereinafter also referred to as "NMP"), diethylene glycol dimethyl ether, and propylene glycol monomethyl ether. The organic solvents may be used alone or in combination of two or more kinds thereof. Among these, the organic solvent having a boiling point of 150° C. to 230° C. is preferable. Further, hereinafter, in the present specification, the organic solvent having a boiling point of 150° C. to 230° C. is also referred to as a "high-boiling point solvent".

In the case where the boiling point of the organic solvent is 150° C. or higher and such the organic solvent is contained as the residual solvent in the interlayer resin film, it is possible to further suppress generation of large irregularities on the surface of the obtained interlayer insulating layer and voids in the interlayer insulating layer, and in the case where the boiling point of the organic solvent is 230° C. or lower, it is possible to suppress generation of the organic solvent remaining after formation of the interlayer insulating layer.

As the high-boiling point solvent, diethylene glycol dimethyl ether, diethylene glycol monomethyl ether, γ-butyrolactone, mesitylene, DMAc, cyclohexanone, or NMP is preferable. From the same viewpoint, the boiling point of the high-boiling point solvent is preferably 160° C. to 230° C., more preferably 160° C. to 220° C., and still more preferably 165° C. to 220° C.

The content of the high-boiling point solvent is preferably 5% to 50% by mass, and more preferably 8% to 40% by mass, in a total amount of the organic solvent included in the varnish for a wiring embedding layer. In the case where the content of the high-boiling point solvent is 5% by mass or more, it is easy to adjust the content of the high-boiling point solvent in the residual solvent to a suitable range, and in the case where the content of the high-boiling point solvent is 50% by mass or less, it is possible to achieve easy drying and energy saving.

It is preferable that the varnish for a wiring embedding layer is subjected to a stirring treatment in a heating environment. The heating temperature is preferably 40° C. to 80° C., and more preferably 50° C. to 70° C. The heating time is preferably 10 minutes or more, and more preferably 20 to 60 minutes. By performing the heating and stirring treatment, a mixed state of the resin and the inorganic filler in the varnish is improved, the dispersion state of the inorganic filler is stabilized, and at the same time, a temporal change of the varnish viscosity can be suppressed.

From the viewpoints of the solubility of the resin, the mixing state, the application and drying workability, the concentration of the solid content of the varnish for a wiring embedding layer is preferably 50% to 85% by mass, more preferably 60% to 80% by mass, and still more preferably 65% to 75% by mass. In the case where the concentration of the solid content is 50% by mass or more, drying efficiency is excellent, and a state where the resin and the inorganic filler are uniformly dispersed in the interlayer insulating layer is exhibited. In addition, in the case where the concentration of the solid content is 85% by mass or less, the solubility and the mixing properties of the resin are improved, and thus, workability of an application operation and the like are excellent.

In order to improve the dispersibility of the inorganic filler and the like, it is preferable that the varnish for a wiring embedding layer and a varnish for an adhesion assisting layer which will be described later are subjected to a dispersion treatment.

Examples of the dispersion treatment method include methods such as an emulsion method and a dispersion method. Examples of an apparatus used for the dispersion treatment include a batch-type emulsifier such as Homogenizer (manufactured by IKA), Polytron (registered trademark) (manufactured by Kinematica AG), and TK Auto Homo Mixer (manufactured by Primix Corporation); a continuous emulsifier such as Ebara Milder (manufactured by Ebara Corporation), TK Filmix (registered trademark) and TK Pipeline Homo Mixer (manufactured by Primix Corporation), a three-roll mill, a bead mill, Colloid Mill (manufactured by Shinco Pantec Co., Ltd.), Slasher and Trigonal Wet Pulverizer (manufactured by Nippon Coke & Engineering Co., Ltd.), Cavitron (manufactured by Eurotec Co., Ltd.), and Fine Flow Mill (manufactured by Pacific Machinery & Engineering Co., Ltd.); a high-pressure emulsifier such as Microfluidizer (manufactured by Mizuho Industrial Co., Ltd.), Nanomizer (manufactured by Nanomizer Inc.), and APV Gaulin (manufactured by Gaulin); a membrane emulsifier such as Membrane Emulsifier (manufactured by Reica Co., Ltd.); a vibration emulsifier such as Vibro Mixer (manufactured by Reica Co., Ltd.); an ultrasonic emulsifier such as Ultrasonic Homogenizer (manufactured by Branson); a high pressure impingement device such as a Gaulin-type high-pressure homogenizer, Microfluidizer Z-type Nozzle (manufactured by Mizuho Industrial Co., Ltd.), Microfluidizer Y-type Nozzle (manufactured by Mizuho Industrial Co., Ltd.), NanoVater (registered trademark) (manufactured by Yoshida Kikai Co., Ltd.), Altimizer (manufactured by Sugino Machine Limited), and DeBEE (manufactured by BEE International, Inc.); and an ultrasonic dispersing device using an ultrasonic vibration energy by an ultrasonic vibrator. Among these, from the viewpoint of uniformity of particle diameters, APV Gaulin, Homogenizer, TK Auto Homo Mixer, Ebara Milder, TK Filmix, TK Pipeline Homo Mixer are preferable. Further, from the viewpoints of productivity and dispersibility, it is preferable that at least one dispersion treatment selected from the group consisting of a bead mill treatment, a 3-roll mill treatment, and a high-pressure collision treatment is performed. These dispersion methods may also be applied in combination of any two or more thereof.

[Other Components]

The thermosetting resin composition (I) may also contain, in addition to the above components (a) to (e), a thermoplastic resin such as a phenoxy resin; a thickener such as Orben and Benton; an adhesion imparting agent such as an imidazole-based adhesion imparting agent, a thiazole-based adhesion imparting agent, a triazole-based adhesion imparting agent, and a silane coupling agent; a coloring agent such as phthalocyanine blue, phthalocyanine green, iodine green, disazo yellow, and carbon black; a flame retardancy imparting resin such as a bromine resins and a phosphorus-containing resin; a flow control agent; a leveling agent; a rubber component; an organic filler; or the like.

<Adhesion Assisting Layer (B)>

The adhesion assisting layer (B) is a layer obtained by forming the thermosetting resin composition (II) into a layer.

The adhesion assisting layer (B) is a layer provided so as to ensure adhesiveness between the surface of an interlayer insulating layer formed by thermosetting and a conductor layer formed above.

In the production of a multi-layered wiring board, irregularities are formed by removing smears while roughening the surface of the interlayer insulating layer, as described above, but by forming the adhesion assisting layer (B) having excellent adhesiveness with the conductor layer on the surface of the interlayer insulating layer, excellent adhesiveness with the conductor layer is obtained even with small irregularities.

In the interlayer insulating film of the present invention, the adhesion assisting layer (B) may be in an uncured state or may be in a semi-cured state.

The adhesion assisting layer (B) is formed for the purpose of assisting the adhesion as described above. Accordingly from the viewpoint of sufficiently exerting the function of the wiring embedding layer (A), the thickness of the adhesion assisting layer (B) with respect to the total thickness of the wiring embedding layer (A) and the adhesion assisting layer (B) is preferably small, and specifically, the thickness is preferably 1 to 15 µm, more preferably 2 to 10 µm, and still more preferably 3 to 7 µm. In the case where the thickness of the adhesion assisting layer (B) is 1 µm or more, the adhesiveness with the conductor layer can be improved, and in the case where the thickness of the adhesion assisting layer (B) is 15 µm or less, a balance between the function of the wiring embedding layer (A) and the function of the adhesion assisting layer (B) can be improved.

(Thermosetting Resin Composition (II))

The thermosetting resin composition (II) contains a thermosetting resin.

Examples of the thermosetting resin include the same thermosetting resins that are contained in the thermosetting resin composition (I), and among these, from the viewpoint of excellent chemical resistance, the epoxy resin (hereinafter also referred to as an "epoxy resin (a')") is preferable.

[Epoxy Resin (a')]

Examples of the epoxy resin (a') include the same as the epoxy resin (a), and a preferred aspect thereof is the same.

The content of the epoxy resin (a') in the thermosetting resin composition (II) is preferably 30 to 90 parts by mass, more preferably 40 to 80 parts by mass, and still more preferably 40 to 70 parts by mass, with respect to 100 parts by mass of the solid content of the thermosetting resin composition (II) excluding an inorganic filler (d') which will be described later. In the case where the content of the epoxy resin (a') is 30 parts by mass or more, the chemical resistance of the interlayer insulating layer is excellent, and in the case where the content of the epoxy resin (a') is 90 parts by mass or less, the curability of the thermosetting resin composition (II) is improved.

Moreover, the thermosetting resin composition (II) preferably contains an epoxy resin having a softening point of 40° C. or higher, and more preferably contains a multifunctional epoxy resin having a softening point of 40° C. or higher, as the epoxy resin (a').

The content of the epoxy resin having a softening point of 40° C. or higher in the epoxy resin (a') is preferably 70% by mass or more, more preferably 80% by mass or more, and still more preferably 85% by mass or more.

[Epoxy Curing Agent (b')]

In the case where the thermosetting resin composition (II) contains the epoxy resin (a') as the thermosetting resin, it is preferable that the thermosetting resin composition (II) contains an epoxy curing agent (b').

Examples of the epoxy curing agent (b') include the same as the epoxy curing agent (b), and a preferred aspect thereof is the same.

The content of the epoxy curing agent (b') is preferably such an amount that the equivalent ratio [(b')/(a')] of the active hydrogen of the epoxy curing agent (b') to the epoxy group of the epoxy resin (a') is 0.5 to 1.5, and more preferably such an amount that the equivalent ratio [(b')/(a')] is 0.8 to 1.2.

[Curing Accelerator (c')]

From the viewpoint of accelerating a curing reaction, it is preferable that the thermosetting resin composition (II) further contains a curing accelerator (c').

Examples of the curing accelerator (c') include the same as the curing accelerator (c), and a preferred aspect thereof is the same.

From the viewpoints of curability and storage stability, the content of the curing accelerator (c') in the thermosetting resin composition (II) is preferably 0.05 to 5 parts by mass, more preferably 0.1 to 3 parts by mass, and still more preferably 0.2 to 2 parts by mass, with respect to 100 parts by mass of the epoxy resin (a').

[Inorganic Filler (d')]

It is preferable that the thermosetting resin composition (II) further contains an inorganic filler (d').

By incorporating the inorganic filler (d') into the adhesion assisting layer (B), it is possible to reduce the thermal expansion coefficient of the interlayer insulating layer, and also enhance high-frequency characteristics (reduction in Dk and reduction in Df) and an elastic modulus. Further, in the case where the interlayer insulating layer is subjected to laser processing, it is possible to prevent resin scattering, and thus, improve the laser processing shape of the interlayer insulating layer. In addition, in the case where irregularities are formed on the surface of the interlayer insulating layer with an oxidizing agent or the like, it is possible to form suitable irregularities, and thus, form a conductor layer having excellent adhesiveness with the conductor layer.

Examples of the inorganic filler (d') include the same of the inorganic filler (d). Among those, silica is preferable. From the viewpoint that fine wiring is formed on the interlayer insulating layer, it is preferable that the average particle diameter of the inorganic filler (d') is small, and the average particle diameter is preferably 1 μm or less, more preferably 0.5 μm or less, and still more preferably 0.1 μm or less.

Examples of silica having an average particle diameter of 0.1 μm or less include fumed silica and sol gel silica. From the viewpoints of insulation reliability and heat resistance, as the fumed silica, fumed silica having good dispersibility in the epoxy resin (a') is preferable, and "AEROSIL (registered trademark) R972", "AEROSIL (registered trademark) R202" (manufactured by Nippon Aerosil Co., Ltd), and the like, that are fumed silica whose surface is treated for hydrophobization, are commercially available.

The inorganic filler (d') may be an inorganic filler subjected to a surface treatment with a surface treatment agent such as the silane coupling agent as described above in order to improve the moisture resistance.

In the case where the thermosetting resin composition (II) contains the inorganic filler (d'), the content of the inorganic filler (d') is preferably 1 to 40 parts by mass, more preferably 3 to 20 parts by mass, and still more preferably 5 to 15 parts by mass, with respect to 100 parts by mass of the solid content of the thermosetting resin composition (II). In the case where the content of the inorganic filler (d') is 1 part by mass or more, the thermal expansion coefficient of the interlayer insulating layer, high-frequency characteristics, laser processability and the adhesiveness with the conductor layer are excellent, and in the case where the content of the inorganic filler (d') is 40 parts by mass or less, embeddability and fine wiring properties are excellent.

[Organic Solvent (e')]

From the viewpoint of productivity of the interlayer insulating film, it is preferable that the thermosetting resin composition (II) contains an organic solvent (e'). Further, in the present specification, the thermosetting resin composition (II) containing an organic solvent is sometimes referred to as a "varnish for an adhesion assisting layer".

Examples of the organic solvent (e') contained in the varnish for an adhesion assisting layer include the same as the organic solvent contained in the varnish for a wiring embedding layer. Among these, as for the varnish for a wiring embedding layer, a high-boiling point solvent is preferably contained, and a preferred content thereof is also the same.

From the viewpoints of the solubility of the resin, the mixing state, the application, and the drying workability, the concentration of the solid content of the varnish for an adhesion assisting layer is preferably 10% to 60% by mass, more preferably 15% to 50% by mass, and still more preferably 20% to 40% by mass. In the case where the concentration of the solid content is 10% by mass or more, the drying efficiency is excellent and a state where the resin and the inorganic filler are uniformly dispersed in the interlayer insulating layer is obtained. In addition, in the case where the concentration of the solid content is 60% by mass or less, the solubility of the resin and the mixing properties are improved, and thus, workability of an application operation and the like are excellent.

In order to improve the dispersibility of the inorganic filler and the like, it is preferable that the varnish for an adhesion assisting layer is subjected to a dispersion treatment. Examples of the dispersion treatment method include the same methods as the methods mentioned as the dispersion treatment method for the varnish for a wiring embedding layer.

[Heat-Resistant Resin (f')]

It is preferable that the thermosetting resin composition (II) further contains a heat-resistant resin (f'). By incorporating the heat-resistant resin (f') into the thermosetting resin composition (II), elongation properties are imparted to the adhesion assisting layer (B), and the adhesiveness between the interlayer insulating layer and the conductor layer can be further improved.

The heat-resistant resin (f') is preferably one capable of being dissolved in the organic solvent. Examples of the heat-resistant resin (f') include at least one resin selected from the group consisting of a polyamide resin, a polyimide resin, and a polyamideimide resin, and copolymers having the chemical structures of these resins. The heat-resistant resin (f') may be used alone or in combination of two or more kinds thereof. Among these, the polyamide resin is preferable.

The polyamide resin preferably contains a functional group (a phenolic hydroxy group, an amino group, or the like) that reacts with a thermosetting resin (for example, an epoxy group of an epoxy resin), and more preferably contains a phenolic hydroxy group. Further, from the same viewpoint, it is preferable that the polyamide resin is a phenolic hydroxy group-containing polybutadiene-modified polyamide resin that contains a polybutadiene skeleton.

As the phenolic hydroxy group-containing polybutadiene-modified polyamide resin, a commercially available product may be used, and examples of the commercially available product include "BPAM-01" and "BPAM-155", each of which is a polyamide resin manufactured by Nippon Kayaku Co., Ltd.

Furthermore, examples of a commercially available product of the heat-resistant resin (f') other than the polyamide resin include "RIKACOAT (registered trademark) SN20" and "RIKACOAT (registered trademark) PN20", each of which is a soluble polyimide, manufactured by New Japan Chemical Co., Ltd., "Ultem" which is a soluble polyetherimide, manufactured by SABIC Innovative Plastics, and "VYLOMAX (registered trademark) HR11NN" and "VYLOMAX (registered trademark) HR16NN", each of which is a soluble polyamideimide, manufactured by Toyobo Co., Ltd.

Among these, "BPAM-01" and "BPAM-155" are preferable from the viewpoint of the adhesiveness between the interlayer insulating layer and the conductor layer, and the viewpoint of the irregularities on the surface in the case of performing a roughening treatment.

From the viewpoints of the solubility in a solvent and the film thickness maintaining properties of the adhesion assisting layer after lamination, the number average molecular weight of the polyamide resin is preferably 20,000 to 30,000, more preferably 22,000 to 29,000, and still more preferably 24,000 to 28,000.

The weight average molecular weight of the polyamide resin is preferably 100,000 to 140,000, more preferably 103,000 to 130,000, and still more preferably 105,000 to 120,000, from the same viewpoint.

In addition, the number average molecular weight and the weight average molecular weight are obtained by measurement using a calibration curve in terms of standard polystyrene, by means of gel permeation chromatography (GPC) manufactured by Tosoh Corporation, and specifically measured by the method described in Examples.

From the viewpoint of improving the adhesiveness with the conductor layer, it is preferable that the heat-resistant resin (f') has an elongation at break of 10% or more, an elastic modulus at 50° C. of 1 GPa or less, and a glass transition temperature of 160° C. or higher.

The elongation at break is determined in accordance with the method described in Japanese Industrial Standards (JIS) K7127. Incidentally in the present invention, an expression, "the glass transition temperature is 160° C. or higher", also encompasses a case where the glass transition temperature is higher than the decomposition temperature, and the glass transition temperature cannot be substantially observed. Further, the decomposition temperature is a temperature at which the amount of mass reduction as measured in accordance with the method described in JIS K7120 becomes 5%.

From the viewpoint of improving the adhesiveness between the interlayer insulating layer and the conductor layer, the content of the heat-resistant resin (F') is preferably 1 to 30 parts by mass, more preferably 5 to 20 parts by mass, and still more preferably 5 to 15 parts by mass, with respect to 100 parts by mass of the solid content of the thermosetting resin composition (II) excluding the inorganic filler (d').

[Other Components]

The thermosetting resin composition (II) may contain, in addition to the above components (a') to (f'), the other components. Examples of such other components include the same as the other components which may be contained in the thermosetting resin composition (I).

<Residual Solvent>

The residual solvent contained in the interlayer insulating film of the present invention refers to an organic solvent contained in one or more layers selected from the group consisting of the wiring embedding layer (A) and the adhesion assisting layer (B). By the residual solvent contained, it is possible to improve the handling properties of the interlayer insulating film.

The residual solvent may be obtained by allowing the organic solvent contained in the varnish for a wiring embedding layer to remain or by allowing the organic solvent contained in the varnish for an adhesion assisting layer to remain, but from the viewpoint of suppressing the mixing of the wiring embedding layer (A) and the adhesion assisting layer (B), the residual solvent is preferably obtained by allowing the organic solvent contained in the varnish for a wiring embedding layer to remain.

The content of the residual solvent is 1% to 10% by mass, preferably 2% to 7% by mass, and more preferably 2.5% to 6.5% by mass, in a total amount of the wiring embedding layer (A) and the adhesion assisting layer (B). In the case where the content of the residual solvent is 1% by mass or more, the handling properties of the interlayer insulating film are improved, and in the case where the content of the residual solvent is 10% by mass or less, the stickiness of the thermosetting resin composition is suppressed and excellent workability is obtained.

The content of the residual solvent can be determined from a difference in weight before and after drying, after the interlayer insulating film is dried at 200° C. for 15 minutes to evaporate the solvent. Further, the type and the concentration of the organic solvent in the residual solvent can be measured by a gas chromatography method utilizing gas chromatography.

The content of the high-boiling point solvent in a total amount of the residual solvent is 10% by mass or more, preferably 20% by mass or more, more preferably 30% by mass or more, and particularly preferably 40% by mass or more. In the case where the content of the high-boiling point solvent is 10% by mass or more, it is possible to suppress generation of large irregularities on the surface of the obtained interlayer insulating layer and voids in interlayer insulating layer.

<Support Film (C)>

It is preferable that the interlayer insulating film of the present invention has a support film (C), and has the wiring embedding layer (A), the adhesion assisting layer (B), and the support film (C) in this order. The support film (C) serves as a support in the production of the interlayer insulating film of the present invention, and is usually peeled or removed finally in the production of a multi-layered printed wiring board using the interlayer insulating film of the present invention.

Examples of the support film (C) include an organic resin film, a metal foil, and a release paper.

Examples of materials for the organic resin film include polyolefins such as polyethylene and vinyl chloride; polyesters such as polyethylene terephthalate (hereinafter also referred to as "PET") and polyethylene naphthalate; polycarbonates; and polyimides. Among these, from the viewpoint of cost and handling properties, PET is preferable.

Examples of the metal foil include a copper foil and an aluminum foil. In the case of using the copper foil for a support, the copper foil may be also used as the conductive layer to form a circuit. In this case, as the copper foil, rolled copper, electrolytic copper foil, or the like may be used. In addition, the copper foil having a thickness of, for example, 2 to 36 μm may be used. In the case of using the copper foil with a small thickness, from the viewpoint of improving the workability, a copper foil having a carrier formed thereon may be used.

Such the support film (C) and a protective film which will be described later may be subjected to a surface treatment such as a release treatment, a plasma treatment, and a corona treatment. Examples of the release treatment include release treatments using a silicone resin-based releasing agent, an alkyd resin-based release agent, a fluorine resin-based release agent, or the like.

From the viewpoint of handling properties, the thickness of the support film (C) is preferably 10 to 120 μm, more preferably 15 to 80 μm, and more preferably 15 to 70 μm.

The support film (C) does not need to be a single component as described above, and may be formed of separate materials in a plurality of layers (two or more layers).

<Protective Film>

The interlayer insulating film of the present invention may have a protective film. The protective film is provided on the surface of the opposite side to the surface on which the support of the interlayer insulating film is provided, and is used for the purpose of preventing adhesion of foreign matter and the like onto the interlayer insulating film and generation of scratches. The protective film is usually peeled before the interlayer insulating film of the present invention is laminated onto a circuit board or the like by lamination, hot pressing, or the like.

As the protective film, the same material as the support film (C) may be used. With respect to the thickness of the protective film, a protective film having a thickness of 1 to 40 μm, for example, may be used.

<Lowest Melt Viscosity>

The interlayer insulating film of the present invention is usually used after lamination so as to embed a circuit board, and therefore, the thermosetting resin composition layer (hereinafter also simply referred to as a "thermosetting resin composition layer") formed of two layers of the wiring embedding layer (A) and the adhesion assisting layer (B) preferably has the lowest melt viscosity, by which good embeddability in the range of a lamination temperature is obtained.

Since the lamination temperature is usually 60° C. to 140° C., the lowest melt viscosity of the wiring embedding layer (A) and the adhesion assisting layer (B) (thermosetting resin composition layer) is preferably 5 to 2,000 Pa·s, more preferably 10 to 1,000 Pa·s, and still more preferably 20 to 500 Pa·s in the range of 60° C. to 140° C. In the case where the lowest melt viscosity is 5 Pa·s or more, there is no case where the resin flows extremely during the lamination and oozes out from the substrate, and in the case where the lowest melt viscosity is 2,000 Pa·s or less, the embeddability of the circuit board is improved.

The lowest melt viscosity may be measured under the conditions described in WO01/97582A, and the lowest melt viscosity as described above is a value in the case of measurement at a temperature elevation rate of 5° C./min.

[Method for Producing Interlayer Insulating Film]

The method for producing the interlayer insulating film of the present invention is a method for producing the interlayer insulating film for a multi-layered printed wiring board of the present invention, which includes the following steps 1 and 2.

Step 1: A step of applying a thermosetting resin composition (II) onto a support film (C), followed by drying, to form an adhesion assisting layer (B)

Step 2: A step of applying a thermosetting resin composition (I) onto the adhesion assisting layer (B), followed by drying, to form a wiring embedding layer (A)

<Step 1>

The step 1 is a step of applying the curable resin composition (II) onto the support film (C), followed by drying, to form the adhesion assisting layer (B).

Examples of a method for applying the thermosetting resin composition (II) include a method of performing application using a known coating device such as a comma coater, a bar coater, a kiss coater, a roll coater, a gravure coater, and a die coater. The coating device may be appropriately selected according to a desired film thickness.

The drying conditions vary depending on the types and amounts of the organic solvent in the thermosetting resin composition (II), but for example, the drying temperature is preferably 50° C. to 180° C., more preferably 100° C. to 170° C., and still more preferably 120° C. to 160° C. Further, the drying time is preferably 0.5 to 20 minutes, more preferably 1 to 10 minutes, and still more preferably 2 to 7 minutes.

In addition, the drying conditions are preferably adjusted such that the lowest melt viscosity of the thermosetting resin composition layer satisfies the preferred range, and are also preferably adjusted such that the content of the residual solvent after the drying is within a preferred range which will be described later.

From the viewpoint of suppressing the mixing upon application of the varnish for a wiring embedding layer onto the adhesion assisting layer (B), the content of the residual solvent in a total amount of the adhesion assisting layer (B) after the drying in the step 1 is preferably 3% by mass or less, more preferably 2% by mass or less, and still more preferably 1% by mass or less.

<Step 2>

The step 2 is a step of applying the thermosetting resin composition (I) onto the adhesion assisting layer (B), followed by drying, to form the wiring embedding layer (A).

Examples of the device used for application in the step 2 include the same as the device used in the step 1.

The drying conditions vary depending on the types and amounts of the organic solvent in the thermosetting resin composition (I), but for example, the drying temperature is preferably 30° C. to 150° C., more preferably 50° C. to 140° C., and still more preferably 70° C. to 130° C. Further, the drying time is preferably 0.5 to 20 minutes, more preferably 1 to 10 minutes, and still more preferably 2 to 7 minutes.

The drying conditions of the step 2 are preferably set such that the amount of the residual solvent in the obtained interlayer resin film and the content of the high-boiling point solvent in the residual solvent are within the suitable ranges.

It is preferable that the adhesion assisting layer (B) and the wiring embedding layer (A) formed on the support film (C) are formed such that they have smaller surface areas than that of the support film (C) (in the case of a roll, they have a smaller width than that of the support film (C)).

In addition, in the interlayer insulating film of the present invention, the protective film as described above may be formed on the wiring embedding layer (A), as desired. The obtained interlayer insulating film may be wound in a roll shape, preserved, and stored.

Furthermore, the method for producing an interlayer insulating film, in which the adhesion assisting layer (B) is formed and then the wiring embedding layer (A) is formed on the adhesion assisting layer (B), is described above, but other examples of the method include a production method in which an interlayer insulating film having the wiring embedding layer (A) formed on the support film (C) and an interlayer insulating film having the adhesion assisting layer (B) formed on the support film (C) are laminated such that the wiring embedding layer (A) and the adhesion assisting layer (B) are in contact with each other.

In this case, the interlayer insulating film of the present invention has a layer configuration having the support film (C), the wiring embedding layer (A), the adhesion assisting layer (B), and the support film (C) in this order, and the support film (C) being in contact with the wiring embedding layer (A) functions as a protective film.

[Multi-Layered Printed Wiring Board]

Next, a method for producing a multi-layered printed wiring board using the interlayer insulating film for a multi-layered printed wiring board of the present invention will be described.

The multi-layered printed wiring board may be produced by, for example, a production method including the following steps (1) to (6), provided that the step (3) is optional, in which a support may be peeled or removed after the step (1), (2), or (3).

(1) A step in which the interlayer insulating film of the present invention is laminated on one side or both sides of a circuit board (hereinafter referred to as a laminating step (1)).

(2) A step in which the interlayer insulating film laminated in the step (1) was thermoset to form an insulating layer (hereinafter referred to as an insulating layer forming step (2)).

(3) A step in which the circuit board having the insulating layer formed thereon in the step (2) is drilled (hereinafter referred to as a drilling step (3)).

(4) A step in which the surface of the insulating layer is subjected to a roughening treatment with an oxidizing agent (hereinafter referred to as a roughening treatment step (4)).

(5) A step in which a conductor layer is formed on the roughened surface of the insulating layer by plating (hereinafter referred to as a conductor layer forming step (5)).

(6) A step in which a circuit is formed on the conductor layer (hereinafter referred to as a circuit forming step (6)).

The laminating step (1) is a step of laminating the interlayer insulating film of the present invention on one side or both sides of a circuit board using a vacuum laminator. Examples of the vacuum laminator include a vacuum applicator manufactured by Nichigo-Morton Co., Ltd., a vacuum & pressure-type laminator manufactured by Meiki Co., Ltd., a roll-type dry coater manufactured by Hitachi Industries Co., Ltd., and a vacuum laminator manufactured by Hitachi Chemical Electronics Co., Ltd.

In the case where a protective film is provided on the interlayer insulating film, it is possible to perform the lamination by peeling or removing the protective film, and then compressing the resultant onto the circuit board under pressurizing and heating such that the wiring embedding layer (A) of the interlayer insulating film of the present invention is in contact with the circuit board.

The lamination may be carried out, for example, at a compression temperature of 60° C. to 140° C. and a compression pressure of 0.1 to 1.1 MPa ($9.8 \times 10^4$ to $107.9 \times 10^4$ N/m$^2$) under a reduced pressure having an air pressure of 20 mmHg (26.7 hPa) or less, as desired, after pre-heating the interlayer insulating film and the circuit board. Further, the laminating method may be in a batch-type or a continuous type by a roll.

Furthermore, from the viewpoint of embeddability, it is preferable that the lamination temperature is determined depending on the melt viscosity characteristics of the thermosetting resin composition layer of the interlayer insulating film. The melt viscosity characteristics may be determined using a temperature-melt viscosity curve obtained by the measurement of a dynamic viscoelastic modulus. For example, in the case where the measurement is performed at a measurement starting temperature of 40° C. and a temperature elevation rate of 5° C./min, it is preferable that the lamination is performed in a temperature range in which the melt viscosity becomes less than 1,000 Pa·s, and it is more preferable that the lamination is performed in a temperature range in which the melt viscosity becomes less than 500 Pa·s from the viewpoint of wiring embeddability.

In the insulating layer forming step (2), first, the interlayer insulating film laminated on the circuit board in the laminating step (1) is cooled to approximately room temperature.

In the case of peeling the support, the support is peeled, and then the interlayer insulating film laminated on the circuit board is heated and cured to form an interlayer insulating layer.

The heating and curing may be carried out in two stages, and the conditions therefor are as follows: for example, in the first stage, the heating and curing is performed at 100° C. to 200° C. for 5 to 30 minutes, and in the second stage, the heating and curing is performed at 140° C. to 220° C. for 20 to 80 minutes. In the case of using a support subjected to a release treatment, the support may be peeled after thermosetting.

The insulating layer may be subjected to a drilling step (3), as desired, after the insulating layer is formed by the method described above. The drilling step (3) is a step of drilling the circuit board and the formed insulating layer by a method using a drill, a laser, a plasma, a combination thereof, or the like to form via holes, through holes, or the like. Examples of the laser include a carbonate gas laser, a YAG laser, a UV laser, and an excimer laser.

In the roughening treatment step (4), the surface of the insulating layer is subjected to a roughening treatment with an oxidizing agent. Further, in the case where via holes, through holes, or the like are formed on the insulating layer and the circuit board, a so-called "smear" that is generated upon formation of the via holes, the through holes, or the like may be removed with an oxidizing agent.

The roughening treatment and the removal of the smear can be performed simultaneously.

Examples of the oxidizing agent include permanganates (for example, potassium permanganate and sodium permanganate), bichromates, ozone, hydrogen peroxide, sulfuric acid, and nitric acid. Among these, an alkaline permanganate solution (for example, a sodium hydroxide solution of potassium permanganate or sodium permanganate) as an oxidizing agent that is widely used for roughening of an insulating layer in the production of a multi-layered printed wiring board by a build-up process.

By the roughening treatment, anchors of irregularities are formed on the surface of the insulating layer.

In the conductor layer forming step (5), a conductor layer is formed by plating on the surface of the insulating layer having the anchors of the irregularities formed thereon by roughening.

Examples of the plating method include an electroless plating method and an electrolytic plating method. A metal for plating is not particularly limited as long as it is a metal that can be used in plating. Examples of the metal for plating may be selected from copper, gold, silver, nickel, platinum, molybdenum, ruthenium, aluminum, tungsten, iron, titanium, chromium, or an alloy including at least one of these metal elements, copper or nickel is preferable, and copper is more preferable.

In addition, a method in which a plating resist having a reverse pattern with respect to a conductor layer (wiring pattern) is formed, and then the conductor layer (wiring pattern) is formed only by the electroless plating may be employed.

After forming the conductor layer, an annealing treatment may be carried out at 150° C. to 200° C. for 20 to 120 minutes. By carrying out the annealing treatment, the adhesiveness between the interlayer insulating layer and the conductor layer tends to be further improved and stabilized. In addition, by the annealing treatment, curing of the interlayer insulating layer may proceed.

In the circuit forming step (6), as a method of patternwise processing the conductor layer to form a circuit, a known method such as a subtractive method, a full additive method, a semi-additive process (SAP) method, and a modified semi-additive process (m-SAP) method may be used.

The surface of the conductive layer thus prepared may be roughened. By roughening the surface of the conductor layer, the adhesiveness with the resin in contact with the conductive layer tends to be improved. For the roughening of the conductive layer, an organic acid-based microetching agent "CZ-8100", "CZ-8101", or "CZ-5480" (all manufactured by MEC Co., Ltd.), or the like may be used.

Examples of the circuit board used in the multi-layered printed wiring board include a substrate, such as a glass epoxy, a metal substrate, a polyester substrate, a polyimide substrate, a BT resin substrate, and a thermosetting polyphenylene ether substrate, which has a patterned conductor layer (circuit) formed on one side or both sides thereof.

Moreover, the circuit board in the present invention encompasses a multi-layered printed wiring board having a conductor layer and an insulating layer being alternately layered, and having a patterned conductor layer (circuit) on one side or both sides thereof, a circuit board having an interlayer insulating layer formed from the interlayer insulating film of the present invention on one side or both sides of the circuit board and having a patterned conductor layer (circuit) on one side or both sides thereof a circuit board having a patterned conductor layer (circuit) on one side or both sides of a cured product (as a layered structure, an adhesion assisting layer, a wiring embedding layer, a wiring embedding layer, and an adhesion assisting layer are included in this order) formed by laminating the interlayer insulating films of the present invention, followed by curing; and the like.

From the viewpoint of adhesiveness of the interlayer insulating layer with the circuit board, the surface of the conductive layer of the circuit board may be subjected to a roughening treatment in advance by a blackening treatment or the like.

Incidentally, a semiconductor package may be produced by mounting a semiconductor chip, a memory, or the like in a predetermined position of the obtained multi-layered printed wiring board.

EXAMPLES

Hereinafter, the present invention will be described in detail with reference to Examples, but the present invention is not limited thereto.

[Preparation of Varnish for Adhesion Assisting Layer and Film for Adhesion Assisting Layer]

Production Example 1B 52.6 parts by mass (57.7 parts by mass with respect to 100 parts by mass of the solid content of the thermosetting resin composition (II) excluding the inorganic filler (d')) of a biphenyl aralkyl-type epoxy resin (manufactured by Nippon Kayaku Co., Ltd., trade name: NC-3000-H, concentration of solid content: 100% by mass, softening point: 70° C.) as the epoxy resin (a'), 21.7 parts by mass of a cresol novolac resin (manufactured by DIC Corporation, trade name: PHENOLITE (registered trademark) KA1165, concentration of solid content: 100% by mass) as the epoxy curing agent (b'), 0.5 parts by mass of 2-phenylimidazole (manufactured by Shikoku Chemicals Corporation, concentration of solid content: 100% by mass) as the curing accelerator (c'), 8.8 parts by mass (8.8 parts by mass with respect to 100 parts by mass of the solid content of the thermosetting resin composition (II)) of fumed silica (manufactured by Nippon Aerosil Co., Ltd., trade name: AEROSIL (registered trademark) R972, concentration of solid content: 100% by mass) as the inorganic filler (d'), 146.4 parts by mass of DMAc as the organic solvent (e'), 73.0 parts by mass (8.0 parts by mass with respect to 100 parts by mass of the solid content of the thermosetting resin composition (II) excluding the inorganic filler (d')) of a polyamide resin (manufactured by Nippon Kayaku Co., Ltd., trade name: BPAM-155) dissolved in DMAc (manufactured by Mitsubishi Gas Chemical Corporation, boiling point 165° C.) such that the concentration of the solid content becomes 10% by mass, as the heat-resistant resin (f'), and 30.4 parts by mass of a phenoxy resin (manufactured by Mitsubishi Chemical Corporation, trade name: jER YX8100BH30, concentration of solid content: 30% by mass, a mixed solvent of cyclohexanone and MEK)

were blended such that the concentration of the solid content became 30% by mass, dissolved, and mixed. Further, a dispersion treatment was carried out by means of "NanoVater (registered trademark)" (manufactured by Yoshida Kikai Co., Ltd. to prepare a varnish for an adhesion assisting layer.

The varnish for an adhesion assisting layer obtained above was applied onto a PET film (manufactured by Unitika Ltd., product name: TR-1, thickness: 38 μm) which is the support film (C), with a die coater, such that the thickness after drying became 5 μm, followed by drying under the conditions of 140° C. for 3 minutes, to obtain a film for an adhesion assisting layer.

The content of the residual solvent included in the film for an adhesion assisting layer (provided that the support film (C) was excluded) was 0.3% by mass.

[Preparation of Varnish for Wiring Embedding Layer]

Production Examples 1A to 13A

The compositions each was blended at the blend ratio shown in Table 1 (the numerical values in the table are parts by mass of the solid content, and in the case of a solution (excluding an organic solvent) or a dispersion liquid, a conversion amount of the solid content), the solid content was adjusted to 72% by mass, and the composition was heated and stirred at 60° C. for 30 minutes, and dissolved and mixed. Further, a dispersion treatment was carried out for 20 minutes by means of a bead mill treatment device, "Star Mill (registered trademark) AMC1" manufactured by Ashizawa Finetech Ltd., to obtain each of varnishes 1 to 13 for a wiring embedding layer.

[Production of Interlayer Insulating Film]

Examples 1 to 11 and Comparative Example 1

The varnishes 1 to 12 for a wiring embedding layer prepared in Production Examples 1A to 12A were each applied onto the film for an adhesion assisting layer prepared in Production Example 1B, with a die coater, such that the thickness of the wiring embedding layer after drying became 35 m (a total thickness of the wiring embedding layer and the adhesion assisting layer became 40 μm), followed by drying at 100° C. for 3 minutes, to obtain interlayer insulating films 1 to 12.

Comparative Example 2

The varnish 13 for a wiring embedding layer prepared in Production Example 13A was applied on the film for an adhesion assisting layer prepared in Production Example 1B, with a die coater, such that the thickness of the wiring embedding layer after drying became 35 m (a total thickness of the wiring embedding layer and the adhesion assisting layer became 40 μm), followed by drying at 140° C. for 3 minutes, to obtain an interlayer insulating film 13.

The performance of the interlayer insulating films 1 to 13 obtained above was evaluated by the following methods. The results are shown in Table 1.

[Evaluation Method]

(1) Handling Properties of Interlayer Insulating Film

The interlayer insulating films 1 to 13 each was placed on a mandrel having a diameter of 1 mm such that the support film (C) was on the inner side, and crack generating angles were measured using a mandrel tester (manufactured by Yoshimitsu Seiki Co., Ltd.). A film which caused cracks at less than 180° was designated as "Poor", and a film which did not cause cracks even in the case where the film was 180° bent was designated as "Good".

(2) Presence or Absence of Large Irregularities on Surface of Interlayer Insulating Layer The interlayer insulating films 1 to 13 each was placed on a copper-clad laminate plate (manufactured by Hitachi Chemical Co., Ltd., trade name: MCL-E-679F, thickness of copper foil: 18 μm, thickness of plate: 0.4 mm) having a circuit board formed in advance thereon such that the wiring embedding layer (A) was on the side of the circuit board, and laminated and layered. The lamination was performed under the conditions of a degree of vacuum of 30 mmHg or less, a temperature of 90° C., and a pressure of 0.5 MPa, by means of a batch-type vacuum pressure laminator (manufactured by Meiki Co., Ltd., trade name: MVLP-500).

After the laminate was cooled to room temperature, the support film (C) (PET film) was peeled, followed by heating and curing in a dryer set at 180° C. for 60 minutes, to obtain substrates 1 to 13 for evaluation.

The surface of the interlayer insulating layer of each of the obtained substrates 1 to 13 for evaluation was observed with a metal microscope (manufactured by: Nikon Corporation, trade name: LV150N/Manual type), and the presence or absence of large irregularities (swelling) on the surface of the interlayer insulating layer was confirmed. A substrate on which large irregularities were observed was designated as "Poor", and a substrate on which large irregularities were not observed was designated as "Good".

(3) Presence or Absence of Voids in Interlayer Insulating Layer

The substrates 1 to 13 for evaluation obtained in (2) above each was embedded using an epoxy casting resin, and then a cross-section was formed, thereby obtaining each of samples 1 to 13 for observing a cross-section. Formation of the cross-section was performed under the conditions of an accelerating voltage of 5 kV, a discharge voltage of 3.3 kV an Ar gas flow rate of 1.4 sccm, a processing width of 500 μm, and a processing time of 6 hours, by means of an ion milling apparatus (manufactured by Hitachi High-Technologies Corporation, trade name: E-3500).

The cross-section of the samples 1 to 13 for observing a cross-section was observed with a scanning electron microscope (SEM) (manufactured by Hitachi High-Technologies Corporation, trade name: SV-4700). The samples in which voids having a width of 5 μm or more were found were designated as "Present", and the samples in which voids having a width of 5 μm or more were not found were designated as "Absent".

(4) Glass Transition Temperature (Tg) and (5) Average Thermal Expansion Coefficient The interlayer insulating films 1 to 13 each was arranged on a copper foil (manufactured by Mitsui Metal Industries, Co., Ltd., trade name: MW-G, thickness: 18 μm) such that the side of wiring embedding layer (A) faced the matte surface (roughened surface) of the copper foil, and laminated and layered. The lamination was performed under the conditions of a degree of vacuum of 30 mmHg or less, a temperature of 90° C., and a pressure of 0.5 MPa, by means of a batch-type vacuum pressure laminator (manufactured by Meiki Co., Ltd., trade name: MVLP-500).

After the laminate was cooled to room temperature, the support film (C) (PET film) was peeled, followed by heating and curing in a dryer set at 180° C. for 60 minutes. Thereafter, the copper foil was removed by etching to obtain each of interlayer insulating layers 1 to 13 for measurement of physical properties.

Each of the obtained interlayer insulating layers 1 to 13 for measurement of physical properties was cut into pieces in size with a length of 20 mm and a width of 4 mm, which were used as test pieces, and the glass transition temperature and the thermal expansion coefficient were measured by means of a thermal mechanical analyzer (manufactured by TA Instruments, trade name: TMA-2940). The thermal mechanical analysis was performed by elevating the temperature from room temperature to 200° C. at a temperature elevation rate of 10° C./min to remove strains and then lowering the temperature to −20° C., and performing measurement at up to 250° C. at a temperature elevation rate of 10° C./min. Using the measurement results at −20° C. to 250° C., the glass transition temperature (Tg) was calculated and the average thermal expansion coefficient at 0° C. to 150° C. was determined.

TABLE 1

| | | | | | Example 1 | Example 2 | Example 3 | Example 4 | Example 5 |
|---|---|---|---|---|---|---|---|---|---|
| | | No. of interlayer insulating film | | | 1 | 2 | 3 | 4 | 5 |
| Thermosetting resin composition (I) | Blend amount | Epoxy resin (a) | NC-3000-H | Parts by mass | 29.6 | 29.6 | 29.6 | 29.6 | 29.6 |
| | | | jER806 | Parts by mass | | | | | |
| | | Epoxy curing agent (b) | TD-2090 | Parts by mass | 10.3 | 10.3 | 10.3 | 10.3 | 10.3 |
| | | Curing accelerator (c) | 2PZ-CN | Parts by mass | 0.09 | 0.09 | 0.09 | 0.09 | 0.09 |
| | | Inorganic filler (d) | SO-C2 | Parts by mass | 60.0 | 60.0 | 60.0 | 60.0 | 60.0 |
| | | Organic solvent (e) | Diethylene glycol dimethyl ether (boiling point: 162° C.) | Parts by mass | 9.7 | | | | |
| | | | Diethylene glycol monomethyl ether (boiling point: 192° C.) | Parts by mass | | 9.7 | | | |
| | | | γ-Butyrolactone (boiling point: 204° C.) | Parts by mass | | | 7.8 | | |
| | | | Mesitylene (boiling point: 165° C.) | Parts by mass | | | | 11.7 | |
| | | | DMAc (boiling point: 165° C.) | Parts by mass | | | | | 9.7 |
| | | | Cyclohexanone, (boiling point: 155.6° C.) | Parts by mass | | | | | |
| | | | NMP (boiling point: 202° C.) | Parts by mass | | | | | |
| | | | MEK (boiling point: 79.5° C.) | Parts by mass | 3.5 | 3.5 | 5.4 | 1.5 | 3.5 |
| | Flame retardant | | LA3018-50P | Parts by mass | | | | | |
| | | | HCA-HQ-HS | Parts by mass | | | | | |
| | Total amount of sold content | | | Parts by mass | 100 | 100 | 100 | 100 | 100 |
| | Concentration of solid content of thermosetting resin composition (I) | | | % by mass | 72.0 | 72.0 | 72.0 | 72.0 | 72.0 |
| | Content of organic solvent having boiling point of 150° C. to 230° C. with respect to total organic solvent contained in thermosetting resin composition (I) | | | % by mass | 25.0 | 25.0 | 20.0 | 30.0 | 25.0 |
| | Content of inorganic filler (d) with respect to 100 parts by mass of solid content of thermosetting resin composition (I) | | | Parts by mass | 60.0 | 60.0 | 60.0 | 60.0 | 60.0 |
| | Content of epoxy resin (a) in thermosetting resin composition (I) excluding inorganic filler (d) | | | Parts by mass | 73.9 | 73.9 | 73.9 | 73.9 | 73.9 |
| | Content of multifunctional epoxy resin having softening point of 40° C. or higher in total epoxy resin (a) | | | % by mass | 100 | 100 | 100 | 100 | 100 |
| | Content of residual solvent in total amount of wiring embedding layer (A) and adhesion assisting layer (B) | | | % by mass | 4.0 | 5.0 | 6.0 | 3.9 | 4.5 |
| | Content of organic solvent having boiling point of 150° C. to 230° C. in total amount of residual solvent | | | % by mass | 42 | 52 | 50 | 41 | 39 |
| | Lowest melt viscosity of wiring embedding layer (A) and adhesion assisting layer (B) at 60° C. to 140° C. | | | Pa·s | 72 | 67 | 55 | 89 | 68 |
| Evaluation results | (1) Handling properties of interlayer insulating film | | | Good·Poor | Good | Good | Good | Good | Good |
| | (2) Presence or absence of large irregularities on surface of interlayer insulating layer | | | Good·Poor | Good | Good | Good | Good | Good |
| | (3) Presence or absence of voids in interlayer insulating layer | | | Present·Absent | Absent | Absent | Absent | Absent | Absent |
| | (4) Glass transition temperature (Tg) of interlayer insulating layer | | | ° C. | 163 | 163 | 163 | 163 | 164 |
| | (5) Average thermal expansion coefficient of interlayer insulating layer | | | ppm/° C. | 31 | 30 | 30 | 30 | 29 |

| | | | | | Example 6 | Example 7 | Example 8 | Example 9 | Example 10 |
|---|---|---|---|---|---|---|---|---|---|
| | | No. of interlayer insulating film | | | 6 | 7 | 8 | 9 | 10 |
| Thermosetting resin composition (I) | Blend amount | Epoxy resin (a) | NC-3000-H | Parts by mass | 29.6 | 22.2 | 40.7 | 25.3 | 30.5 |
| | | | jER806 | Parts by mass | | | | 3.6 | |
| | | Epoxy curing agent (b) | TD-2090 | Parts by mass | 10.3 | 7.7 | 14.2 | 11.0 | |
| | | Curing accelerator (c) | 2PZ-CN | Parts by mass | 0.09 | 0.07 | 0.12 | 0.09 | 0.09 |
| | | Inorganic filler (d) | SO-C2 | Parts by mass | 60.0 | 70.0 | 45.0 | 60.0 | 55.0 |
| | | Organic solvent (e) | Diethylene glycol dimethyl ether (boiling point: 162° C.) | Parts by mass | | | | | |
| | | | Diethylene glycol monomethyl ether (boiling point: 192° C.) | Parts by mass | | 18.1 | 3.9 | 5.8 | 8.2 |
| | | | γ-Butyrolactone (boiling point: 204° C.) | Parts by mass | | | | | |
| | | | Mesitylene (boiling point: 165° C.) | Parts by mass | | | | | |
| | | | DMAc (boiling point: 165° C.) | Parts by mass | | | | | |
| | | | Cyclohexanone, (boiling point: 155.6° C.) | Parts by mass | | | | | |
| | | | NMP (boiling point: 202° C.) | Parts by mass | 5.8 | | | | |
| | | | MEK (boiling point: 79.5° C.) | Parts by mass | 7.3 | 1.1 | 15.7 | 7.3 | 4.5 |
| | Flame retardant | | LA3018-50P | Parts by mass | | | | | 4.6 |
| | | | HCA-HQ-HS | Parts by mass | | | | | 9.9 |
| | Total amount of sold content | | | Parts by mass | 100 | 100 | 100 | 100 | 100 |
| | Concentration of solid content of thermosetting resin composition (I) | | | % by mass | 72.0 | 67.0 | 72.0 | 72.0 | 71.0 |

TABLE 1-continued

|  |  | Unit | | | | | |
|---|---|---|---|---|---|---|---|
| Content of organic solvent having boiling point of 150° C. to 230° C. with respect to total organic solvent contained in thermosetting resin composition (I) | | % by mass | 15.0 | 36.8 | 10.0 | 15.0 | 20.0 |
| Content of inorganic filler (d) with respect to 100 parts by mass of solid content of thermosetting resin composition (I) | | Parts by mass | 60.0 | 70.0 | 45.0 | 60.0 | 55.0 |
| Content of epoxy resin (a) in thermosetting resin composition (I) excluding inorganic filler (d) | | Parts by mass | 73.9 | 73.9 | 73.9 | 72.2 | 67.7 |
| Content of multifunctional epoxy resin having softening point of 40° C. or higher in total epoxy resin (a) | | % by mass | 100 | 100 | 100 | 88 | 100 |
| Content of residual solvent in total amount of wiring embedding layer (A) and adhesion assisting layer (B) | | % by mass | 3.2 | 3.1 | 4.0 | 3.5 | 4.5 |
| Content of organic solvent having boiling point of 150° C. to 230° C. in total amount of residual solvent | | % by mass | 52 | 60 | 58 | 64 | 42 |
| Lowest melt viscosity of wiring embedding layer (A) and adhesion assisting layer (B) at 60° C. to 140° C. | | Pa · s | 128 | 402 | 35 | 45 | 108 |
| Evaluation results | (1) Handling properties of interlayer insulating film | Good · Poor | Good | Good | Good | Good | Good |
|  | (2) Presence or absence of large irregularities on surface of interlayer insulating layer | Good · Poor | Good | Good | Good | Good | Good |
|  | (3) Presence or absence of voids in interlayer insulating layer | Present · Absent | Absent | Absent | Absent | Absent | Absent |
|  | (4) Glass transition temperature (Tg) of interlayer insulating layer | ° C. | 164 | 162 | 164 | 157 | 167 |
|  | (5) Average thermal expansion coefficient of interlayer insulating layer | ppm/° C. | 29 | 26 | 37 | 36 | 34 |

|  |  |  |  | | Example | Comparative Example | |
|---|---|---|---|---|---|---|---|
|  |  |  |  | | 11 | 1 | 2 |
|  |  | No. of interlayer insulating film |  | | 11 | 12 | 13 |
| Thermosetting resin composition (I) | Blend amount | Epoxy resin (a) | NC-3000-H | Parts by mass | 30.5 | 29.6 | 29.6 |
|  |  |  | jER806 | Parts by mass |  |  |  |
|  |  | Epoxy curing agent (b) | TD-2090 | Parts by mass |  | 10.3 | 10.3 |
|  |  | Curing accelerator (c) | 2PZ-CN | Parts by mass | 0.09 | 0.09 | 0.09 |
|  |  | Inorganic filler (d) | SO-C2 | Parts by mass | 55.0 | 60.0 | 60.0 |
|  |  | Organic solvent (e) | Diethylene glycol dimethyl ether (boiling point: 162° C.) | Parts by mass |  |  | 9.7 |
|  |  |  | Diethylene glycol monomethyl ether (boiling point: 192° C.) | Parts by mass |  |  |  |
|  |  |  | γ-Butyrolactone(boiling point: 204° C.) | Parts by mass |  |  |  |
|  |  |  | Mesitylene (boiling point: 165° C.) | Parts by mass |  |  |  |
|  |  |  | DMAc (boiling point: 165° C.) | Parts by mass |  |  |  |
|  |  |  | Cyclohexanone, (boiling point: 155.6° C.) | Parts by mass | 20.0 |  |  |
|  |  |  | NMP (boiling point: 202° C.) | Parts by mass |  |  |  |
|  |  |  | MEK (boiling point: 79.5° C.) | Parts by mass | 12.7 | 13.2 | 3.5 |
|  | Flame retardant |  | LA3018-50P | Parts by mass | 4.6 |  |  |
|  |  |  | HCA-HQ-HS | Parts by mass | 9.9 |  |  |
|  | Total amount of sold content |  |  | Parts by mass | 100 | 100 | 100 |
|  | Concentration of solid content of thermosetting resin composition (I) |  |  | % by mass | 71.0 | 72.0 | 72.0 |
|  | Content of organic solvent having boiling point of 150° C. to 230° C. with respect to total organic solvent contained in thermosetting resin composition (I) |  |  | % by mass | 0 | 0 | 25.0 |
|  | Content of inorganic filler (d) with respect to 100 parts by mass of solid content of thermosetting resin composition (I) |  |  | Parts by mass | 55.0 | 60.0 | 60.0 |
|  | Content of epoxy resin (a) in thermosetting resin composition (I) excluding inorganic filler (d) |  |  | Parts by mass | 67.7 | 73.9 | 73.9 |
|  | Content of multifunctional epoxy resin having softening point of 40° C. or higher in total epoxy resin (a) |  |  | % by mass | 100 | 100 | 100 |
|  | Content of residual solvent in total amount of wiring embedding layer (A) and adhesion assisting layer (B) |  |  | % by mass | 4.9 | 4.8 | 0.3 |
|  | Content of organic solvent having boiling point of 150° C. to 230° C. in total amount of residual solvent |  |  | % by mass | 52 | 0 | 52 |
|  | Lowest melt viscosity of wiring embedding layer (A) and adhesion assisting layer (B) at 60° C. to 140° C. |  |  | Pa · s | 124 | 73 | 305 |
| Evaluation results | (1) Handling properties of interlayer insulating film |  |  | Good · Poor | Good | Good | Poor |
|  | (2) Presence or absence of large irregularities on surface of interlayer insulating layer |  |  | Good · Poor | Good | Poor | Good |
|  | (3) Presence or absence of voids in interlayer insulating layer |  |  | Present · Absent | Absent | Present | Absent |
|  | (4) Glass transition temperature (Tg) of interlayer insulating layer |  |  | ° C. | 163 | 163 | 164 |
|  | (5) Average thermal expansion coefficient of interlayer insulating layer |  |  | ppm/° C. | 34 | 30 | 31 |

The respective components in Table 1 are shown below.

[Epoxy Resin (a)]

NC-3000-H: Biphenyl aralkyl-type epoxy resin (manufactured by Nippon Kayaku Co., Ltd., epoxy equivalents: 289 g/eq, concentration of solid content: 100% by mass)

jER806: Bisphenol F-type epoxy resin (manufactured by Mitsubishi Chemical Corporation, epoxy equivalents: 160 to 170 g/eq, concentration of solid content: 100% by mass)

[Epoxy Curing Agent (b)]

TD-2090: Phenol novolac resin (PHENOLITE (registered trademark) TD-2090" manufactured by DIC Corporation, concentration of solid content: 100% by mass)

[Curing Accelerator (c)]
  2PZ—CN: 1-Cyanoethyl-2-phenylimidazole ("CUREZOL (registered trademark) 2PZ—CN" manufactured by Shikoku Chemicals Corporation, concentration of solid content: 100% by mass)

[Inorganic Filler (d)]
  SO—C2: Silica slurry in which spherical silica "SO—C2" (manufactured by Admatechs Co., Ltd., average particle diameter: 0.5 μm) subjected to a treatment with an aminosilane coupling agent (manufactured by Shin-Etsu Chemical Co., Ltd., trade name: KBM573) is dispersed in MEK such that the concentration of the solid content becomes 70% by mass.

[Organic Solvent (e) Having Boiling Point of 150° C. to 230° C.]
  Diethylene glycol dimethyl ether: Manufactured by Sankyo Chemical Industry Co., Ltd., boiling point: 162° C.
  Diethylene glycol monomethyl ether: Manufactured by Sankyo Chemical Industry Co., Ltd., boiling point: 192° C.
  γ-butyrolactone: Manufactured by Sankyo Chemical Industry Co., Ltd., boiling point: 204° C.
  Mesitylene: Manufactured by Kanto Chemical Co., Inc., boiling point: 165° C.
  DMAc: Manufactured by Mitsubishi Gas Chemical Corporation, boiling point: 165° C.
  Cyclohexanone: Manufactured by Sankyo Chemical Industry Co., Ltd., boiling point: 155.6° C.
  NMP: Manufactured by Sankyo Chemical Industry Co., Ltd., boiling point: 202° C.
  MEK: Manufactured by Sankyo Chemical Industry Co., Ltd., boiling point: 79.5° C.

[Flame Retardant]
  LA3018-50P: Aminotriazine-modified novolac-type phenol resin ("PHENOLITE (registered trademark) LA3018-50P" manufactured by DIC Corporation, concentration of solid content: 50% by mass)
  HCA-HQ-HS: 10-(2,5-Dihydroxyphenyl)-9,10-dihydro-9-oxa-10-phospha-phenanthrene-10-oxide (manufactured by Sanko Co., Ltd., concentration of solid content: 100% by mass)

As shown in Table 1, the interlayer insulating films of the present invention of Examples 1 to 11 had good handling properties, the interlayer insulating layers obtained from the interlayer insulating films of the present invention did not have large irregularities on the surface, and voids could not be seen in the resin layer. Further, by using the interlayer insulating films of the present invention, interlayer insulating layers having a low thermal expansion coefficient and a high glass transition temperature were obtained.

On the other hand, the interlayer insulating layer obtained from the interlayer insulating film of Comparative Example 1, which did not contain an organic solvent having a boiling point of 150° C. to 230° C. as the residual solvent, had large irregularities found on the surface thereof and voids were found in the resin layer.

In addition, the interlayer insulating film of Comparative Example 2 in which the content of the residual solvent was less than 1% by mass had deteriorated handling properties.

The invention claimed is:

1. An interlayer insulating film for a multi-layered printed wiring board, comprising:
  a wiring embedding layer (A) obtained by forming a thermosetting resin composition (I) into a layer; and
  an adhesion assisting layer (B) obtained by forming a thermosetting resin composition (II) into a layer,
  wherein the interlayer insulating film contains a residual solvent in an amount of 1% to 10% by mass in a total amount of the wiring embedding layer (A) and the adhesion assisting layer (B), and the residual solvent contains an organic solvent having a boiling point of 160° C. to 230° C. in an amount of from 30% to 64% by mass in a total amount of the residual solvent.

2. The interlayer insulating film for a multi-layered printed wiring board according to claim 1, further comprising a support film (C),
  wherein the interlayer insulating film comprises the wiring embedding layer (A), the adhesion assisting layer (B), and the support film (C) in this order.

3. The interlayer insulating film for a multi-layered printed wiring board according to claim 1,
  wherein the lowest melt viscosity at 60° C. to 140° C. of the wiring embedding layer (A) and the adhesion assisting layer (B) is from 5 to 2,000 Pa·s.

4. The interlayer insulating film for a multi-layered printed wiring board according to claim 1,
  wherein the thermosetting resin composition (I) contains an inorganic filler (d), and the content of the inorganic filler (d) in the thermosetting resin composition (I) is from 40 to 85 parts by mass with respect to 100 parts by mass of the solid content of the thermosetting resin composition (I).

5. The interlayer insulating film for a multi-layered printed wiring board according to claim 1,
  wherein the thermosetting resin composition (I) contains an epoxy resin (a), and the content of the epoxy resin (a) in the thermosetting resin composition (I) is from 20 to 90 parts by mass with respect to 100 parts by mass of the solid content of the thermosetting resin composition (I) excluding the inorganic filler (d).

6. The interlayer insulating film for a multi-layered printed wiring board according to claim 5,
  wherein the thermosetting resin composition (I) contains an epoxy resin having a softening point of 40° C. or higher as the epoxy resin (a).

7. The interlayer insulating film for a multi-layered printed wiring board according to claim 1,
  wherein the thermosetting resin composition (II) contains an inorganic filler (d'), and the content of the inorganic filler (d') in the thermosetting resin composition (II) is from 1 to 40 parts by mass with respect to 100 parts by mass of the solid content of the thermosetting resin composition (II).

8. The interlayer insulating film for a multi-layered printed wiring board according to claim 1,
  wherein the thermosetting resin composition (II) contains an epoxy resin (a'), and the content of the epoxy resin (a') in the thermosetting resin composition (II) is from 30 to 90 parts by mass with respect to 100 parts by mass of the solid content of the thermosetting resin composition (II) excluding the inorganic filler (d').

9. The interlayer insulating film for a multi-layered printed wiring board according to claim 8,
  wherein the thermosetting resin composition (II) contains an epoxy resin having a softening point of 40° C. or higher as the epoxy resin (a').

10. The interlayer insulating film for a multi-layered printed wiring board according to claim 1,
  wherein the thermosetting resin composition (II) contains a heat-resistant resin (f'), and the heat-resistant resin (f') is at least one selected from the group consisting of a polyamide resin, a polyimide resin, and a polyamide-imide resin.

11. The interlayer insulating film for a multi-layered printed wiring board according to claim 10,
wherein the content of the heat-resistant resin (f') in the thermosetting resin composition (II) is from 1 to 30 parts by mass with respect to 100 parts by mass of the solid content of the thermosetting resin composition (II) excluding the inorganic filler (d').

12. The interlayer insulating film for a multi-layered printed wiring board according to claim 1,
wherein the thickness of the wiring embedding layer (A) is from 5 to 60 μm, and the thickness of the adhesion assisting layer (B) is from 1 to 15 μm.

13. A method for producing the interlayer insulating film for a multi-layered printed wiring board according to claim 1, comprising the following steps 1 and 2:
Step 1: a step of applying the thermosetting resin composition (II) onto a support film (C), followed by drying, to form the adhesion assisting layer (B); and
Step 2: a step of applying the thermosetting resin composition (I) onto the adhesion assisting layer (B), followed by drying, to form the wiring embedding layer (A).

14. The method for producing the interlayer insulating film for a multi-layered printed wiring board according to claim 13,
wherein the content of the residual solvent in the adhesion assisting layer (B) before performing the step 2 is 3% by mass or less based on the adhesion assisting layer (B).

15. The method for producing the interlayer insulating film for a multi-layered printed wiring board according to claim 13,
wherein a concentration of the solid content of the thermosetting resin composition (I) is from 50% to 85% by mass, and
the thermosetting resin composition (I) contains an organic solvent having a boiling point of 160° C. to 230° C., and the content of the organic solvent having a boiling point of 160° C. to 230° C. in the thermosetting resin composition (I) is from 5% to 50% by mass in the total organic solvent contained in the thermosetting resin composition (I).

16. The interlayer insulating film for a multi-layered printed wiring board according to claim 1,
wherein the interlayer insulating film contains the residual solvent in an amount of 2.5% to 6.5% by mass in the total amount of the wiring embedding layer (A) and the adhesion assisting layer (B).

17. The interlayer insulating film for a multi-layered printed wiring board according to claim 1,
wherein the interlayer insulating film contains the residual solvent in an amount of 6% by mass in the total amount of the wiring embedding layer (A) and the adhesion assisting layer (B).

18. The interlayer insulating film for a multi-layered printed wiring board according to claim 1,
wherein the residual solvent contains the organic solvent having a boiling point of 160° C. to 230° C. in an amount of from 40% to 60% by mass in a total amount of the residual solvent.

19. The interlayer insulating film for a multi-layered printed wiring board according to claim 1,
wherein the residual solvent contains the organic solvent having a boiling point of 160° C. to 230° C. in an amount of from 30% to 60% by mass in a total amount of the residual solvent.

* * * * *